United States Patent
Yamasaki et al.

(10) Patent No.: US 7,265,489 B2
(45) Date of Patent: Sep. 4, 2007

(54) ORGANIC ELECTROLUMINESCENCE DEVICE AND METHOD OF PRODUCTION OF SAME

(75) Inventors: Takashi Yamasaki, Kanagawa (JP); Hideki Minami, Cyofu (JP)

(73) Assignee: 3M Innovative Properties Co., St. Paul, MN (US)

( * ) Notice: Subject to any disclaimer, the term of this patent is extended or adjusted under 35 U.S.C. 154(b) by 217 days.

(21) Appl. No.: 11/197,249

(22) Filed: Aug. 4, 2005

(65) Prior Publication Data

US 2006/0061267 A1    Mar. 23, 2006

(30) Foreign Application Priority Data

Sep. 17, 2004    (JP)    ............... 2004-271339

(51) Int. Cl.
*H01J 17/00*    (2006.01)
(52) U.S. Cl. ...................... 313/504; 313/506
(58) Field of Classification Search ............... 313/498, 313/504, 506, 512
See application file for complete search history.

(56) References Cited

U.S. PATENT DOCUMENTS

2003/0008224 A1    1/2003    Fujita et al.
2004/0021414 A1    2/2004    Hanawa et al.
2006/0033427 A1    2/2006    Nagayama et al.
2006/0125384 A1    6/2006    Tomita et al.

FOREIGN PATENT DOCUMENTS

| EP | 1 315 209 | 5/2003 |
| EP | 1 453 117 | 9/2004 |
| JP | 2001-130141 | 5/2001 |
| JP | 2002-534782 | 10/2002 |
| WO | WO 00/41892 | 7/2000 |
| WO | WO 2004/021746 | 3/2004 |
| WO | WO 2004/045253 | 5/2004 |

*Primary Examiner*—Vip Patel
(74) *Attorney, Agent, or Firm*—Lance L. Vietzke

(57) ABSTRACT

An organic electroluminescence device having a substrate on which a first electrode is provided on the surface and including at least one projection. A functional layer is provided so as to cover the projection, and a second electrode is formed on that functional layer. A cross-sectional contour of an end of a surface of the projection contacting the functional layer is a shape satisfying a predetermined relationship.

9 Claims, 6 Drawing Sheets

ORGANIC ELECTROLUMINESCENCE DEVICE AND METHOD OF PRODUCTION OF SAME

This application claims priority from Japanese Ser. No. 2004-271339 filed Sep. 17, 2004

The present invention relates to an organic electroluminescence (EL) device and a method of production of the same.

BACKGROUND

An organic EL device is a self light emitting device and therefore does not require a light source. It has a high luminance and enables a reduction of thickness and reduction of weight. Further, it has a much faster response speed compared with liquid crystal and is superior in displaying moving pictures, so is promising as a display to take the place of liquid crystal devices.

Usually, an organic EL device, as shown in FIG. 1, is structured by a glass substrate 11 on which a first electrode 12 and second electrode 15 sandwich a functional layer 16 comprised of an organic material (electronic transport layer 13 and hole transport layer 14). One device forms one pixel of a display panel. In such an organic EL device, when an electric field is applied between the first electrode 12 and second electrode 15 and electrons are injected into the functional layer from the second electrode 15 and holes are injected from the first electrode 12, the electrons and holes recombine to generate photons 17. That is, electrical energy is converted to light energy.

Organic EL devices may be roughly divided into polymeric types and small molecule types in accordance with the types of the organic materials used for the functional layers. In small molecule type organic EL devices, as functional layers, laminates of organic thin films provided with one of the functions of charge injection, charge transport, and light emission or provided with several of these functions are used.

A conventional bottom emission type organic EL flat panel display is generally produced by the following steps. First, a plurality of transparent electrodes (first electrodes) are formed in patterns corresponding to the pixels at predetermined positions on the glass substrate. For forming the transparent electrodes, a film is formed over the entire surface of the glass substrate by the usual sputtering method, then is patterned by photolithography. Next, functional layers are formed in corresponding patterns on the transparent electrode patterns. Next, back electrodes (second electrodes) are formed on the functional layers. For forming the patterns of the functional layers and the back electrodes, an extremely high positional precision is required. Up until now, ink jet print technology and vacuum evaporation technology using masks have mainly been used for forming the patterns.

On the other hand, in recent years, it has been proposed to use the laser transfer method to pattern the functional layers and the back electrodes and produce organic EL devices. This laser transfer method is a type of dry lithography and is a method suitable for transfer of various thin films (in particular organic films). It has been used for forming color filters of liquid crystals etc. or for providing black matrixes.

A general transfer process using the laser transfer method is shown in FIG. 2. The laser transfer method comprises using a special transfer sheet usually called a "donor sheet". A typical donor sheet 20 is comprised of a base 21, a photothermal conversion layer 22, an intermediate layer 23, and a transfer layer 24 stacked in that order (FIG. 2(A)). Normally, this donor sheet 20 is placed on the glass substrate or other substrate 25, the transfer layer 24 and substrate 25 are bonded, then laser light 26 is irradiated at predetermined regions of the photothermal conversion layer 22 as shown by the arrows (FIG. 2(B)). In this case, the photothermal conversion layer 22 converts the light energy to heat energy in the irradiated regions. This heat energy is supplied to the transfer layer 24 through the intermediate layer 23 preventing the photothermal conversion layer 22 to invade the transfer layer 24. In this case, the transfer layer 24 is not supplied with heat energy across its entirety. The supply of the heat energy is limited to the parts near the irradiated regions. As a result, the transfer layer 24 is partially heated (FIG. 2(C)). Further, the heated parts stick to the substrate 25. When the donor sheet is then peeled off from the substrate 25, the image components 27 with certain patterns corresponding to the patterns of irradiation of the laser light 26 separate from the intermediate layer 23 and are transferred to the substrate (FIG. 2(D)).

SUMMARY

When using organic EL devices to produce a flat panel display, first, in general, a glass substrate is provided with electrodes, insulators, device drive transistors, electrical interconnects, pixel isolation layers, and other electrical or electronic parts or members. The functional layers are usually formed in a form coated on these parts or members. These parts or members often form relief shapes on the glass substrate, so the functional layers are required to follow these relief shapes and cover the parts or members.

However, the functional layers of small molecule type organic EL devices are usually a thin 100 nm or so and are inferior in mechanical strength in terms of materials, so if using the above laser transfer method as it is for transfer to the parts or members, the transferred functional layers have difficulty in following the relief shapes on the substrate and easily break. In the case of transfer of color filters etc. to which the laser transfer method has been applied in the past, since the transfer layer is comprised of a polymeric material of a thickness of several μm, the mechanical strength and conformability to relief shapes are sufficient and these problems do not arise.

Due to this problem, the functional layers become sites of concentration of stress at the ends of the projections on the substrate and easily break. In particular, when projections breaking the functional layers are due to the transparent electrodes, the transparent electrodes will become exposed at the broken parts of the functional layers. As a result, short-circuits will form with the back electrodes provided at the back and the organic EL devices will end up no longer being able to be lit up. When the devices are used for a display panel, they will become a cause of lighting defects and poor quality of the display panel.

Therefore, the present invention has as its object the provision of an organic EL device for preventing breakage of a functional layer by a projection on a glass substrate and to a method of production of such an organic EL device by a laser transfer method.

To solve the above problems, according to the present invention, there is provided an organic electroluminescence device having a substrate on which a first electrode is provided on the surface and including at least one projection, a functional layer provided so as to cover the projection, and a second electrode formed on that functional layer, the organic electroluminescence device characterized in that a cross-sectional contour of an end of a surface of the projection contacting the functional layer is a shape shown by the following equation:

$$y = \frac{h}{1 + \exp\left(-\frac{x}{r}\right)}$$

wherein, h is a maximum height (nm) of the projection from its base, x is a distance (nm) in a horizontal direction having as its origin the position where y=h/2, y is a distance (nm) in a thickness direction of the projection, and r is a coefficient showing a smoothness of the cross-sectional shape) and the coefficient r satisfies the following relation:

$r > -2000k + 1550$ wherein, k=t/h and t is a thickness (nm) of the functional layer.

Further, according to the present invention, there is provided an organic electroluminescence device having a transparent substrate, a transparent electrode arranged on the transparent substrate, a functional layer formed on the transparent electrode, and a back electrode formed on the functional layer, the organic electroluminescence device characterized in that a cross-sectional contour of an end of a surface of the transparent electrode contacting the functional layer is a shape shown by the following equation:

$$y = \frac{h}{1 + \exp\left(-\frac{x}{r}\right)}$$

wherein, h is a maximum height (nm) of the transparent electrode from its base, x is a distance (nm) in a horizontal direction having as its origin the position where y=h/2, y is a distance (nm) in a thickness direction of the transparent electrode, and r is a coefficient showing a smoothness of the cross-sectional shape) and the coefficient r satisfies the following relation:

$r > -2000k + 1550$ wherein, k=t/h and t is a thickness (nm) of the functional layer.

Further, according to the present invention, there is provided a method of producing the above organic electroluminescence device, the method of producing an organic electroluminescence device characterized by bringing into contact with the surface of a projection side of a substrate provided with a first electrode on its surface and including at least one projection a transfer layer of a donor sheet comprised of a base and a photothermal conversion layer and transfer layer formed successively on it, irradiating laser light from the base side of the donor sheet to heat the transfer layer, and transferring it on the projection, wherein a cross-sectional contour of an end of a surface of the projection contacting the functional layer is a shape shown by the following equation:

$$y = \frac{h}{1 + \exp\left(-\frac{x}{r}\right)}$$

wherein, h is a maximum height (nm) of the projection from its base, x is a distance (nm) in a horizontal direction having as its origin the position where y=h/2, y is a distance (nm) in a thickness direction of the projection, and r is a coefficient showing a smoothness of the cross-sectional shape) and the coefficient r satisfies the following relation:

$r > -2000k + 1550$ wherein, k=t/h and t is a thickness (nm) of the functional layer.

Further, according to the present invention, there is provided a method of producing the above organic electroluminescence device, the method of producing an organic electroluminescence device characterized by forming a transparent electrode on a transparent substrate, bringing into contact with the surface of the transparent electrode side of the substrate a transfer layer of a donor sheet comprised of a base and a photothermal conversion layer and transfer layer formed successively on it, irradiating laser light from the base side of the donor sheet to heat the transfer layer, and transferring it on the substrate, wherein a cross-sectional contour of an end of a surface of the transparent electrode contacting the transfer layer is a shape shown by the following equation:

$$y = \frac{h}{1 + \exp\left(-\frac{x}{r}\right)}$$

wherein, h is a maximum height (nm) of the transparent electrode from its base, x is a distance (nm) in a horizontal direction having as its origin the position where y=h/2, y is a distance (nm) in a thickness direction of the transparent electrode, and r is a coefficient showing a smoothness of the cross-sectional shape) and the coefficient r satisfies the following relation:

$r > -2000k + 1550$ wherein, k=t/h and t is a thickness (nm) of the functional layer.

In the organic EL device of the present invention, by applying the functional layer as a transfer layer by the laser transfer method, it is possible to produce a pixel pattern of a high precision organic EL device with a high positional precision relatively easily and possible to transfer onto a substrate including relief shapes a functional layer without causing it to break.

DETAILED DESCRIPTION

Figure 1:
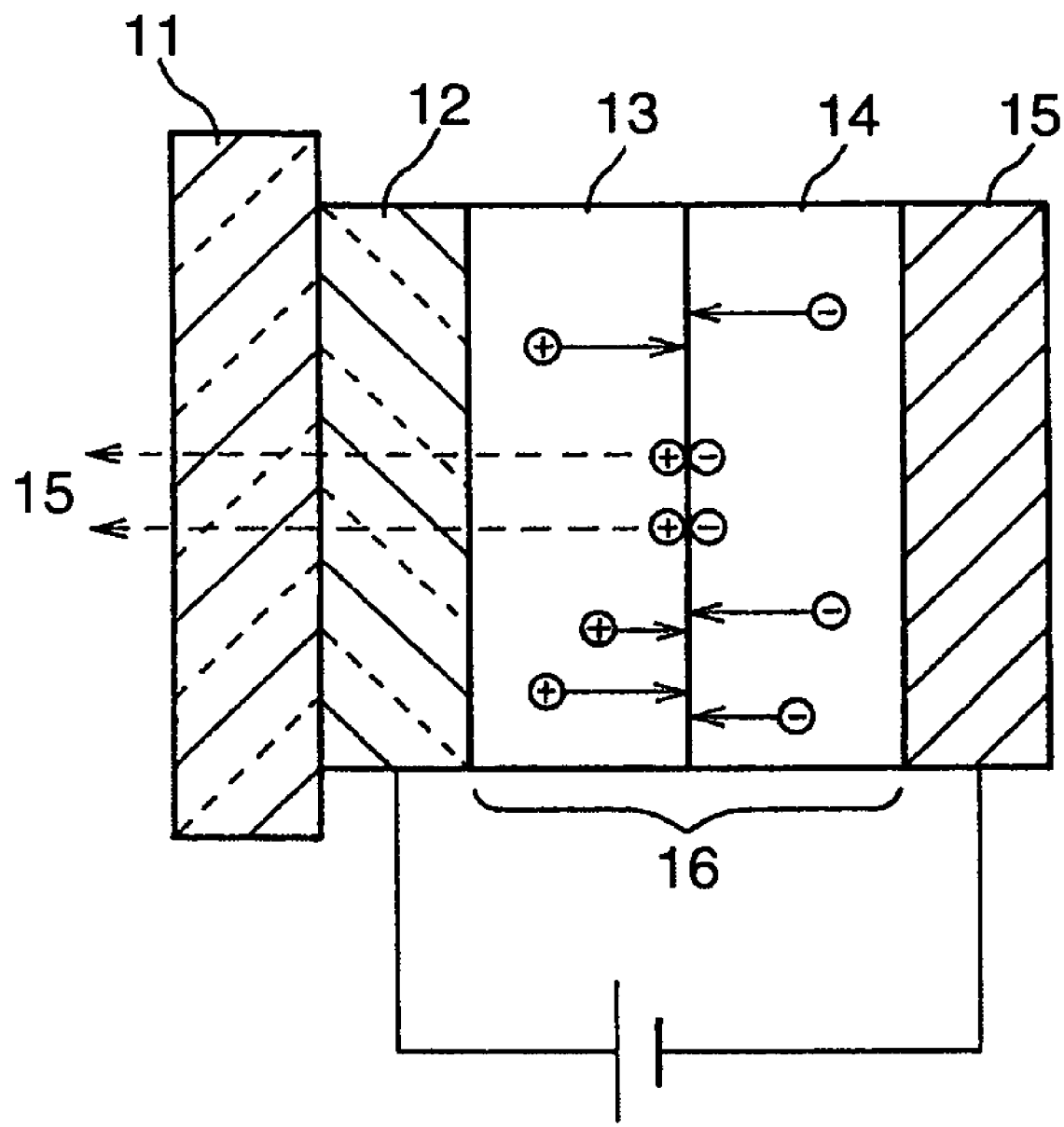
FIG. 1 is a schematic cross-sectional view of the configuration of a conventional organic EL device.
Figure 2A:
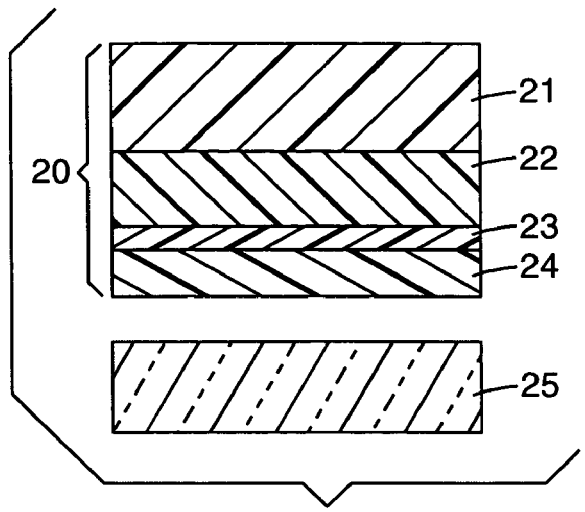
FIG. 2 is a schematic cross-sectional view of a process of transfer of an image pattern to an image receiving device in a laser transfer method.
Figure 2B:
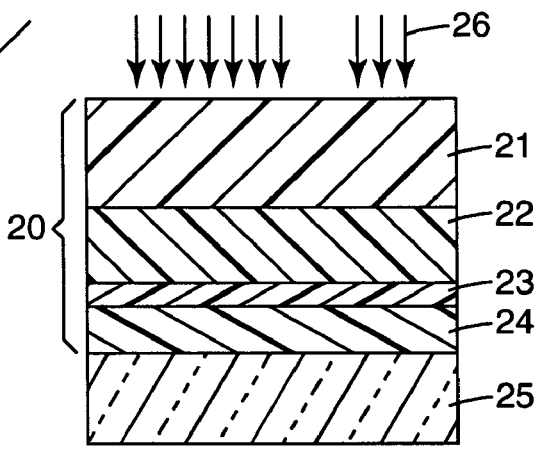
Figure 2C:
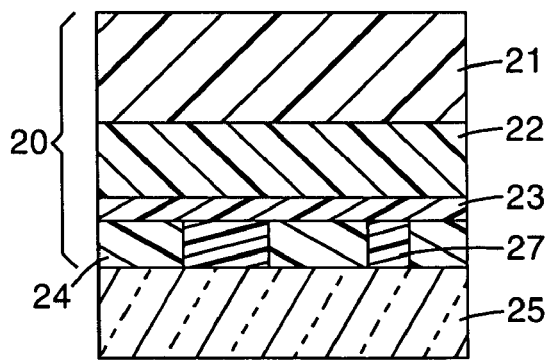
Figure 2D:
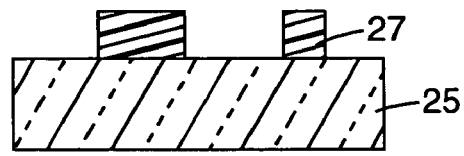
Figure 3:
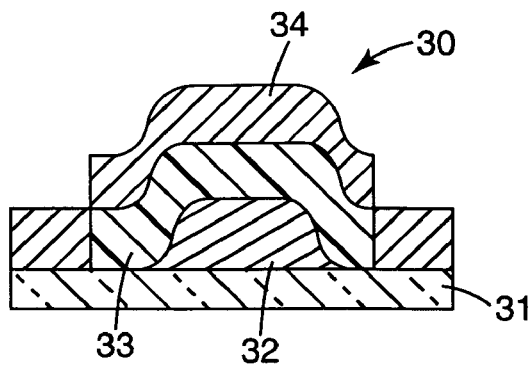
FIG. 3 is a schematic cross-sectional view of the configuration of an organic EL device of the present invention.

Below, the present invention will be explained with reference to the drawings. FIG. 3 is a cross-sectional view of an embodiment of an organic EL device of the present invention. As shown in FIG. 3, the organic EL device 30 of the present invention includes a transparent substrate 31, a transparent electrode 32 arranged on the transparent substrate 31, a functional layer 33 formed on the transparent electrode 32, and a back electrode 34 formed on the functional layer 33.

The transparent substrate 31 is a support and also functions as a surface for taking out light. Therefore, this transparent substrate 31 is selected considering the light transmitting properties and heat stability etc. As the material of the transparent substrate 31, for example, glass, transparent plastic, etc. may be mentioned, but due to its superiority in heat resistance, it is preferable to use glass.

As the material of the transparent electrode 32, indium tin oxide (ITO), a complex oxide of indium oxide and zinc oxide (IZO), etc. may be mentioned. While not shown, the surface of the transparent substrate 31 is sometimes formed with not only the transparent electrode 32, but also an $SiO_2$ or other insulator comprised of an electrically inert material, a device drive transistor comprised of a low temperature polysilicon or low temperature amorphous silicon, electrical interconnects made from gold, silver, copper, or another metal material, and other structures.

The functional layer 33 is a layer exhibiting the functions of transporting the electrons and holes generally used in organic EL devices and recombining them so as to generate light and normally includes an electron transport layer and hole transport layer. The electron transport layer facilitates the injection of electrons and movement of them to the anode. Further, the electron transport layer acts as a barrier obstructing the movement of holes to the cathode. The electron transport layer is for example formed from tris(8-hydroxyquinoline)aluminum (ALQ) or other metal chelate compounds. The hole transport layer facilitates hole injection and movement of these to the cathode. The hole transport layer is for example formed from N,N'-bis(3-methylphenyl)-N,N'-diphenylbenzidine (TPD) or another diamine derivative.

The boundary between the electron transport layer and hole transport layer forms a barrier preventing movement of holes and electrons. Due to this, it forms a recombining zone of holes and electrons. When the electron transport layer is ALQ, the organic EL device emits a blue-green color. By using different materials and dopants in the electron transport layer and hole transport layer, it is possible to emit various colors.

As the material of the back electrode 34, for example, Mg, Al, Li, and other metals may be mentioned. Further, while not shown, it is also possible to provide a protective layer on the back electrode 34. By providing the protective layer, deterioration, damage, peeling, etc. of the back electrode 34 and functional layer 33 can be prevented. As the material constituting the protective layer, an epoxy resin, acryl resin, liquid glass, etc. may be mentioned.

The thickness of the organic EL device is generally a thin one of about 100 nm. When an end of the transparent electrode contacting the functional layer has a sharp cross-sectional shape, the functional layer is liable to break at the end. In particular, when using the laser transfer method to transfer the functional layer to the transparent electrode, stress concentrates at a sharp end of the transparent electrode and the possibility of breakage of the functional layer is high. Therefore, in the present invention, by making an end of the transparent electrode in contact with the functional layer a smooth shape, when transferring the functional layer by the laser transfer method, the functional layer follows the shape of the end of the transparent electrode and breakage of the functional layer is prevented.

To quantize the smoothness of the transparent electrode so as to prevent breakage of the functional layer, the inventors observed the contour shapes of ends of transparent electrodes by an atomic force microscope (AFM), measured the heights (h) of the step differences of the transparent electrode, fit the cross-sectional contours by the following equation (1):

$$y = \frac{h}{1 + \exp\left(-\frac{x}{r}\right)}$$

wherein, h is a maximum height (nm) of the transparent electrode from its base, x is a distance (nm) in a horizontal direction having as its origin the position where y=h/2, y is a distance (nm) in a thickness direction of the transparent electrode, and r is a coefficient showing a smoothness of the cross-sectional shape), and used the obtained coefficient r as an indicator of the smoothness of the ends.

Figure 4:
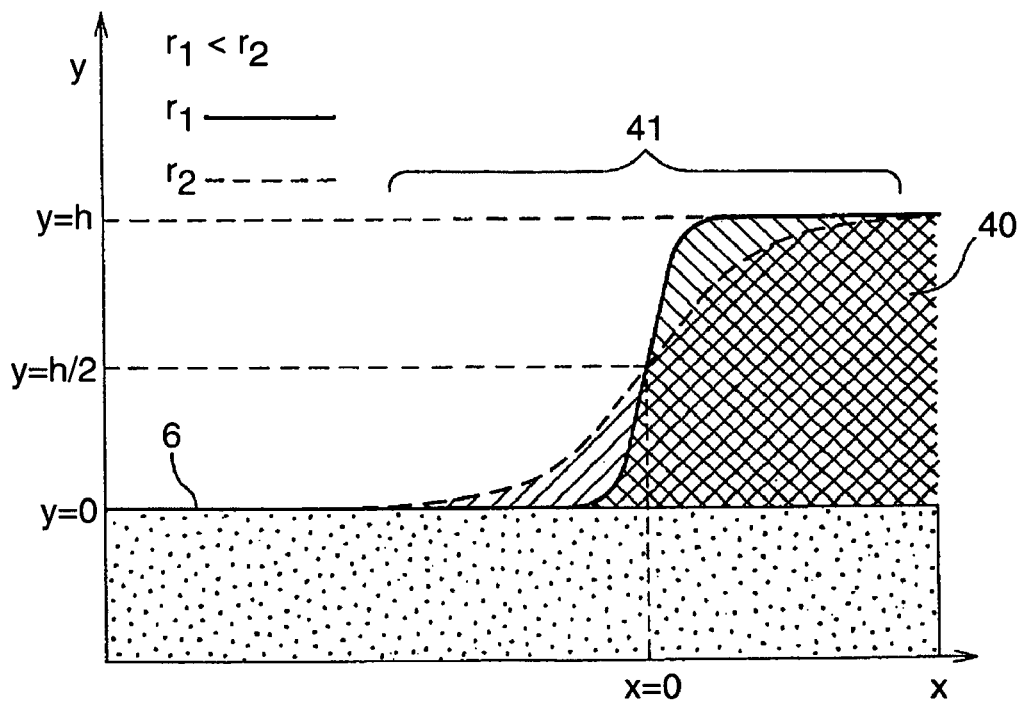
FIG. 4 is a schematic cross-sectional view of the contour structure of an end of a transparent electrode.

As an example showing the effect which this coefficient r has on the smoothness of an end of the transparent electrode, the shapes of the ends of two surface structures expressed by equation (1) are shown in FIG. 4. As clear from FIG. 4, the larger the r-value, the smoother the shape the end exhibits. The inventors discovered that when the coefficient r showing a smoothness of an end 41 of the transparent electrode 40 is in the region satisfying the relationship of equation (2):

$$r > -2000k + 1550$$

with respect to the value k (t/h) standardized by dividing the thickness t of the functional layer by the height h of the transparent electrode 40, the functional layer is transferred by the laser transfer method without breakage of the functional layer.

That is, in the organic EL device of the present invention, the contour of an end of the surface of the transparent electrode contacting the functional layer is shown by equation (1). It is required that the contour be of a cross-sectional shape where the coefficient r showing a smoothness in the equation satisfies the relationship of the above equation (2).

As the method for obtaining a transparent electrode having a suitable value of the coefficient r for the shape of the end, the case of use of using an ITO electrode as a transparent electrode will be explained. Normally, an ITO film on the substrate is patterned by forming an ITO film on the entire surface of the substrate by sputtering, then using photolithography. The ITO film is patterned by photolithography by the following process. First, a photoresist laminated and coated on the surface of the ITO film is exposed and developed, then dry or wet etched. The etchant, etching temperature, etching time, and other etching conditions may be adjusted in accordance with the quality and thickness of the ITO film. For example, in an organic EL ITO film of Sanyo Vacuum Industries, as conditions for obtaining an ITO film of a thickness of 150±10 nm, wet etching by immersion in an oxalic acid aqueous solution of a molar concentration of 47% at a temperature of 45±2° C. is recommended. As the etching solution of the ITO film, other than an oxalic acid aqueous solution, a ferric chloride aqueous solution, iodine aqueous solution, phosphoric acid solution, hydrochloric acid and nitric acid mixed solution, etc. may be mentioned. Next, a peeling solution is used to peel off the photoresist, then the substrate is rinsed. After sufficient rinsing, the substrate is dried.

In the patterning process of the ITO film explained above, as one example of the method for obtaining a transparent electrode having a suitable value of the coefficient r, there is the method of suitably raising the etching rate from the substrate toward the film surface. Due to this, the film surface becomes more easily etched and end structures having a desired smoothness can be obtained. Specifically, it is possible to raise the oxygen concentration of the ITO film from the substrate toward the film surface and reduce the degree of crystallization of the ITO film from the substrate to the film surface. Further, when there is no anistropy in the etching rate of the ITO film, by washing the substrate from which the photoresist is peeled, then etching the entire ITO film patterned on the substrate by a slight amount, any pointed part formed at a pattern end of the film is cut away. Due to this, it is possible to obtain an ITO film having end shapes having the desired smoothness.

Below, a method of production of an organic EL device of the present invention using the laser transfer method will be explained. First, a transparent electrode having predetermined end structures is formed on the substrate as explained above. Separate from this, a donor sheet having a functional layer for transfer to a transparent electrode is formed.

Figure 5:
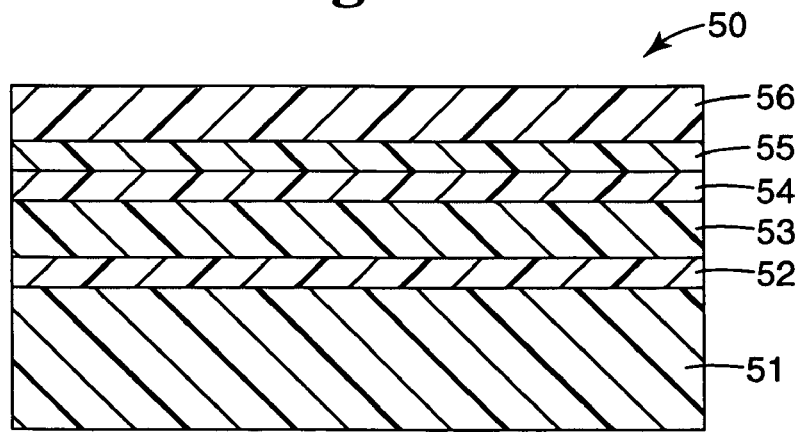
FIG. 5 is a schematic cross-sectional view of the configuration of a donor sheet.

FIG. 5 shows the configuration of the donor sheet. The donor sheet 50 includes a base 51, any primer layer 52, a photothermal conversion layer 53, any intermediate layer 54, any peeling layer 55, and a transfer layer 56.

The base 51 can be formed from various natural and synthetic materials so long as they can satisfy the requirements sought from the donor sheet. The conditions required for this base include, for example, a transmitting property of laser light and heat resistance since laser light is irradiated for heating to transfer the transfer layer and a suitable flexibility, lightness, handling, mechanical strength, etc. since the base is used bonded to the transfer layer etc. and is peeled off after use. Therefore, it is possible to use a polymer film. One suitable type of polymer film is a polyester film, for example, a polyethylene terephthalate or polyethylene naphthalate film. The general thickness of the base is usually in the range of 0.01 to 2.54 mm, but a thicker or thinner base may also be used.

In general, the material used for forming the base 51 and photothermal conversion layer 53 is selected so as to improve the bond between the photothermal conversion layer 53 and base 51. To improve the uniformity of the coating of the layers and improve the interlayer bonding strength of the photothermal conversion layer 53 and base 51, it is possible to use any primer layer 52. An example of a suitable substrate 51 having a primer layer 52 can be obtained from Teijin (Product No. HPE100).

The photothermal conversion layer 53 absorbs laser light and converts at least part of the light energy to heat energy so as to melt at least part of the transfer layer 56 and enable the transfer of the transfer layer to the transparent electrode. Therefore, the photothermal conversion layer 53 is preferably comprised of a light absorbing material itself or a layer containing such a light absorbing material dispersed in it. In several embodiments, there is no independent photothermal conversion layer 53. Instead, it is possible to arrange a light absorbing material at another layer of a donor sheet such as the base 51 or transfer layer 56. In another embodiment, the donor sheet includes a photothermal conversion layer 53. Further, for example, the donor sheet includes a photothermal conversion layer 53 or includes an additional light absorbing material arranged at one or more layers of the donor sheet such as the base 51 or transfer layer 56.

In general, the light absorbing material absorbs light of the infrared, visible, and/or ultraviolet region of the electromagnetic spectrum. Suitable light absorbing materials include for example dyes (visible dyes, ultraviolet dyes, infrared dyes, fluorescent dyes, and radiation deflecting dyes), pigments, metals, metal compounds, metal film, or other suitable absorbing materials. Specifically, carbon black, metal oxides, and metal sulfides may be mentioned. As one example of a suitable photothermal conversion layer 53, there is a layer comprised of carbon black or another pigment dispersed in an organic polymer or other binder. As another suitable photothermal conversion layer 53, there is a metal or a metal/metal oxide formed as a thin film such as black aluminum (that is, aluminum partially oxidized and having a black visual appearance). The metal and metal compound films may be formed by for example sputtering, evaporation, or other technologies. The particle coating may be formed using a binder and all sorts of suitable wet or dry coating technologies.

The dye suitable for use as a light absorbing material of the photothermal conversion layer 53 is dissolved in the binder material or is provided in a particle form at least partially dispersed in a binder material. When a dispersion particle light absorbing material is used, the particle size may be made not more than about 10 μm, even not more than about 1 μm, in at least several examples. Suitable dyes include dyes which absorb light of the IR region of the spectrum. It is possible to select a specific dye based on factors such as the solubility in a specific binder and/or coating solvent, the compatibility with the same, the wavelength region of the absorption, etc.

Further, in the photothermal conversion layer 53, it is also possible to use a pigment material as the light absorbing material. Suitable examples of pigments include carbon black and graphite, phthalocyanine, nickel dithiolene, and other pigments. Further, for example, black azo pigments based on copper or chrome compounds of pyrazolone-based yellow, dianisidine-based red, and nickel azo-based yellow copper are useful. For example, it is also possible to use inorganic pigments including oxides and sulfides of aluminum, bismuth, tin, indium, zinc, titanium, chrome, molybdenum, tungsten, cobalt, iridium, nickel, palladium, platinum, copper, silver, gold, zirconium, iron, lead, tellurium, and other metals. Metal borides, carbides, nitrides, carbonitrides, bronze structure oxides, and oxides related structurally to the bronze family (for example $WO_{2.9}$) may be used.

Further, as the film, it is possible to use a metal light absorbing material. Suitable metals include for example aluminum, bismuth, tin, indium, tellurium, and zinc.

As explained above, particles of light absorbing materials are dispersed in the binder. In calculation of the weight percent, the solvent is excluded. The weight percent of the particles of light absorbing materials in the coating is generally 1 wt % to 30 wt %, preferably 3 wt % to 20 wt %, most preferably 5 wt % to 15 wt %.

The binder suitable for use in the photothermal conversion layer 53 includes for example a phenol resin (for example, novolak and resol resins), a polyvinyl butyral resin, polyvinyl acetate, polyvinyl acetal, polyvinylidene chloride, polyacrylate, cellulose ethers and esters, nitrocellulose, polycarbonate, and other film-forming polymers. Suitable binders may include monomers, oligomers, or polymers polymerized or cross-linked or able to be polymerized or cross-linked. In several embodiments, the binder is formed using coating of an oligomer including an initially cross-linkable monomer and/or any polymer. When a polymer is used for the binder, the binder includes 1 to 50 wt %, preferably 10 to 45 wt % of the polymer (solvent excluded when calculating the wt %).

When coating on the base 51, the monomer, oligomer, and polymer are cross-linked and a photothermal conversion layer 53 is formed. In several examples, when the cross-linking of the photothermal conversion layer 53 is too low, the photothermal conversion layer 53 may be damaged by the heat and part of the photothermal conversion layer 53 will sometimes be transferred to the transparent electrode.

By including the thermoplastic resin (for example, polymer), in at least several examples, the performance of the photothermal conversion layer 53 (for example, the transfer characteristics and/or coating ability) can be improved. The thermoplastic resin can be considered to improve the bonding of the photothermal conversion layer 53 to the base 51. In one embodiment, the binder includes 25 to 50 wt % (solvent excluded when calculating wt %) of a thermoplastic resin, preferably 30 to 45 wt % of the thermoplastic resin, but it is also possible to use a smaller amount of the thermoplastic resin (for example, 1 to 15 wt %). The thermoplastic resin is generally selected so as to have compatibility with materials other than the binder. In at least several embodiments, as the binder, a thermoplastic resin having a solubility parameter in the range of 9 to 13 $(cal/cm^3)^{1/2}$, preferably 9.5 to 12 $(cal/cm^3)^{1/2}$ is selected. Examples of suitable thermoplastic resins include polyacryl resins, styrene-acryl polymers and resins, and polyvinyl butyral.

To facilitate the coating process, a surfactant, dispersant, or other conventional coating aid may be added. The photothermal conversion layer 53 may be coated on the base using various known coating methods in this technical field. The polymer or organic photothermal conversion layer, in at least several examples, is coated to a thickness of 0.05 μm to 20 μm, preferably 0.5 μm to 10 μm, most preferably 1 μm to 7 μm. The inorganic photothermal conversion layer, in at least several examples, is coated to a thickness of 0.001 to 10 μm, preferably 0.002 to 1 μm.

The intermediate layer 54 is any layer used for minimizing damage and contamination of the transfer part of the transfer layer 56. The intermediate layer 54 can reduce the distortion of the transfer part of the transfer layer 56. Further, the intermediate layer 54 may have an influence on the bonding of the transfer layer 56 to the remaining part of the donor sheet. In general, the intermediate layer 54 has a high heat resistance. In general, the intermediate layer 54 maintains the state of contact with the photothermal conversion layer 53 during the transfer process and is substantially not transferred together with the transfer layer 56.

As a suitable intermediate layer 54, for example, a polymer film, metal layer (for example, evaporated metal layer), inorganic layer (for example, a sol-gel deposition layer and evaporated layer of an inorganic oxide (for example, silica, titania, or other metal oxides)), and an organic/inorganic complex layer may be mentioned. The organic material suitable as an intermediate layer material includes both heat curing materials and thermoplastic materials. The suitable heat curing materials are not limited, but cross-linked or cross-linkable polyacrylates, polymethacrylates, polyesters, epoxy, and polyurethane are included. Resins obtainable by cross-linking by heat, radiation, or chemical treatment may be mentioned. The heat curing material may for example be coated on the photothermal conversion layer as a thermoplastic precursor and then cross-linked, whereby a cross-linked intermediate layer 54 is formed.

As a suitable thermoplastic material, for example, a polyacrylate, polymethacrylate, polystyrene, polyurethane, polysulfone, polyester, and polyimide may be mentioned. These thermoplastic organic materials may be coated by a conventional coating technology (for example, solvent coating, spray coating, or extrusion coating). In general, the glass transition temperature (Tg) of the thermoplastic material suited for use at the intermediate layer 54 is at least 25° C., preferably at least 50° C., more preferably at least 100° C., most preferably at least 150° C. The intermediate layer 54 preferably is provided with transmitting, absorbing, and reflecting properties or a combination of these properties at the wavelength of the laser light.

As an inorganic material suitable as an intermediate layer material, for example, a metal, metal oxide, metal sulfide, and inorganic carbon coating including a material with a high transmitting property or reflecting property at the wavelength of image formation light may be mentioned. These materials may be coated on the photothermal conversion layer 53 by conventional technologies (for example, vacuum sputtering, vacuum evaporation, or plasma jet deposition).

The intermediate layer 54 can give a large number of advantages. The intermediate layer 54 can become a barrier to the transfer of materials from the photothermal conversion layer 53. Further, the temperature reached at the transfer layer 56 can be adjusted so as to enable a thermally unstable material to be transferred. Further, due to the existence of the intermediate layer, the plastic memory in the transfer material is improved.

The intermediate layer 54 may include a mixer including for example a photoinitiator, a surfactant, a pigment, a plasticizer, and a coating aid. The thickness of the intermediate layer 54 is determined for example by factors such as the material of the intermediate layer 54, the material of the photothermal conversion layer 53, the material of the transfer layer 56, the wavelength of the laser light, etc. In the case of the polymer intermediate layer, the thickness of the intermediate layer 54 is generally 0.05 μm to 10 μm, preferably about 0.1 μm to 4 μm, more preferably 0.05 to 3 μm, most preferably 0.8 to 2 μm. In the case of an inorganic intermediate layer (for example, a metal or metal compound intermediate layer), the thickness of the intermediate layer 54 is generally 0.005 μm to 10 μm, preferably about 0.01 μm to 3 μm, more preferably about 0.02 to 1 μm.

The peeling layer 55 is generally any layer for facilitating the peeling of the transfer layer 56 from the other parts of the heat transfer device (for example, the intermediate layer 54 and/or photothermal conversion layer 53) when heating the heat transfer device by for example a light emitting source or heating device. In at least several cases, before the peeling layer 55 is exposed to heat, the transfer layer 56 is bonded somewhat to other parts of the donor sheet. Suitable peeling layers 55 include for example conductive and nonconductive thermoplastic polymers, conductive and nonconductive filling polymers, and/or conductive and nonconductive dispersants. Suitable examples of polymers include acryl polymers, polyaniline, polythiophene, poly(phenylenevinylene), polyacetylene, and other conductive organic materials. Suitable examples of conductive dispersants include carbon black, graphite, ultrafine particle indium tin oxide, ultrafine antimony tin oxide, etc. Other suitable materials of the peeling layer 55 include for example sublimatable insulating materials and sublimatable semiconductor materials.

The peeling layer 55 may be part of the transfer layer 56 or a separate layer. All or part of the peeling layer 55 may be transferred together with the transfer layer 56. Alternatively, almost all or substantially all of the peeling layer 55 remains at the base 51 when the transfer layer 56 is transferred. In several examples, for example, when the peeling layer 55 includes a sublimable material, part of the peeling layer 55 is emitted during the transfer process.

The transfer layer 56 includes one or more layers for the functional layer on the transparent electrode. These one or more layers are formed by the hole transport layer, electron transport layer, and back electrode in the above functional layer. While not shown, a bonding layer may be arranged at the outer surface of the transfer layer for facilitating bonding with the transparent electrode. This bonding layer for example includes conductive and nonconductive thermoplastic polymers, conductive and nonconductive filling polymers, and/or conductive and nonconductive dispersants. Suitable examples of polymers include acryl polymer, polyaniline, polythiophene, poly(phenylenevinylene), polyacetylene, and other conductive organic materials. Suitable examples of conductive dispersants include carbon black, graphite, ultrafine particle indium tin oxide, ultrafine antimony tin oxide, etc.

The layers of the donor sheet can be formed by coating ingredients having a predetermined composition by for example the spin coat method, gravure method, die coating method, or other commonly used coating method and then drying them.

Figure 6A:
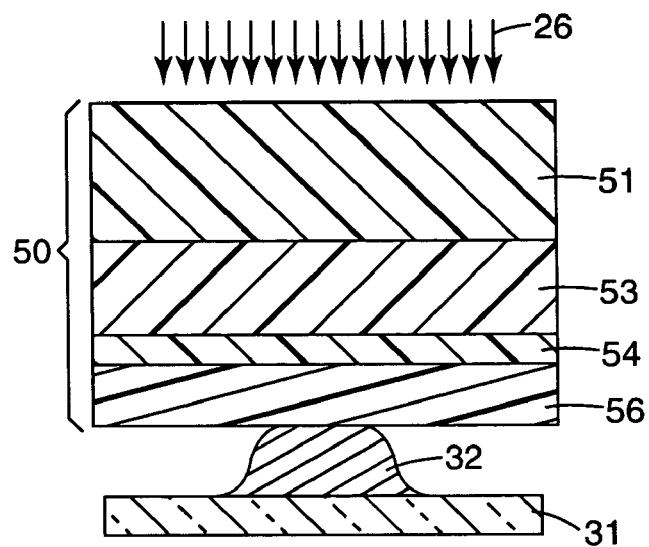
FIG. 6 is a schematic cross-sectional view of a process of production of an organic EL device by the laser transfer method of the present invention.
Figure 6B:
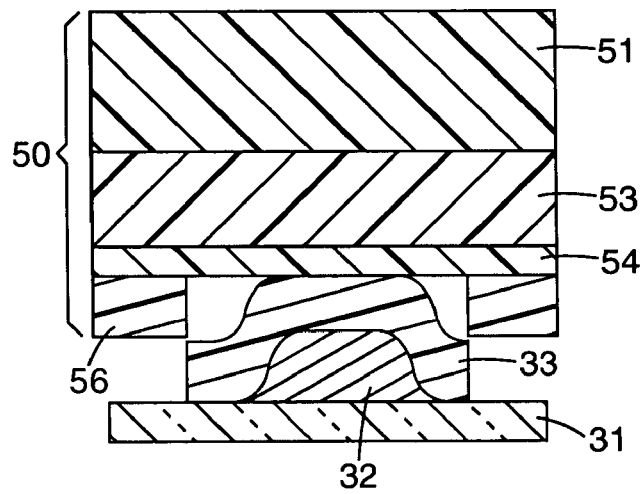
Figure 6C:
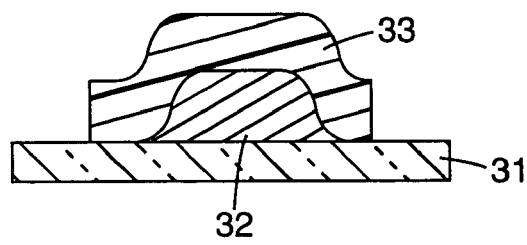

The thus prepared donor sheet, as shown in FIG. 6, is arranged so that the transfer layer 56 comes into close contact with the transparent electrode 32. Laser light 26 is irradiated by predetermined patterns from the base 50 side of the donor sheet 50 (FIG. 6(A)). The patterns of this laser light 26 correspond to the patterns of the transfer layer 56 to be transferred to the transparent electrode 32. As the laser light 26, it is possible to use an infrared, visible, and ultraviolet laser. For example, a high output (100 W or higher) single mode laser diode, fiber-coupled laser diode, and diode pump solid laser (for example, Nd:YAG and Nd:YLF) may be used. The laser exposure time and laser strength are of a sufficient extent for melting part of the transfer layer 56 and transferring it to the transparent electrode 32. They may be suitably set according to the material, thickness, etc. of the transfer layer, photothermal conversion layer, etc.

As a result of the irradiation of the patterns by this laser light 26, the light energy of the laser light 26 is converted into heat energy by the action of the photothermal conversion layer 53. Further, the heat energy is made uniform by the action of the intermediate layer 54. As a result, the transfer layer 56 receives the supply of the heat energy, and the transfer layer 56 is fixed as the functional layer 33 on the surface of the transparent electrode 32 by patterns of laser light 26 (FIG. 6(B)). Next, when the donor sheet 50 is peeled off the transparent electrode 32, the functional layer 33 is peeled off the intermediate layer 54 and the transfer is completed. Due to this, the functional layer 33 is formed in a manner so as to cover the transparent electrode 32 (FIG. 6(C)).

In this way, as the transfer layer 56, the functional layer of an organic EL device, that is, at least part of the electron transport layer and hole transport layer, may be included. Further, the back electrode may be included as part of the transfer layer 56. Further, the surface of the transparent electrode 32 may be covered in advance by part of the functional layer before transfer of the transfer layer 56. When the transfer layer 56 includes a back electrode, the organic EL device of the present invention is completed by the transfer of the transfer electrode 56. When the transfer layer 56 does not include a back electrode, the organic EL device of the present invention is completed by transferring the transfer layer 56 to form the functional layer 33, then form the back electrode on the functional layer 33 (FIG. 3).

In the above way, in the laser transfer method, the functional layer is formed by transferring the transfer layer to cover the transparent layer, but the contour of the end of the surface of the transparent electrode contacting the transfer layer forms a predetermined shape, so the transfer layer can sufficiently follow the relief shapes at the time of transfer at the end of the transparent electrode and will not break.

Figure 7:
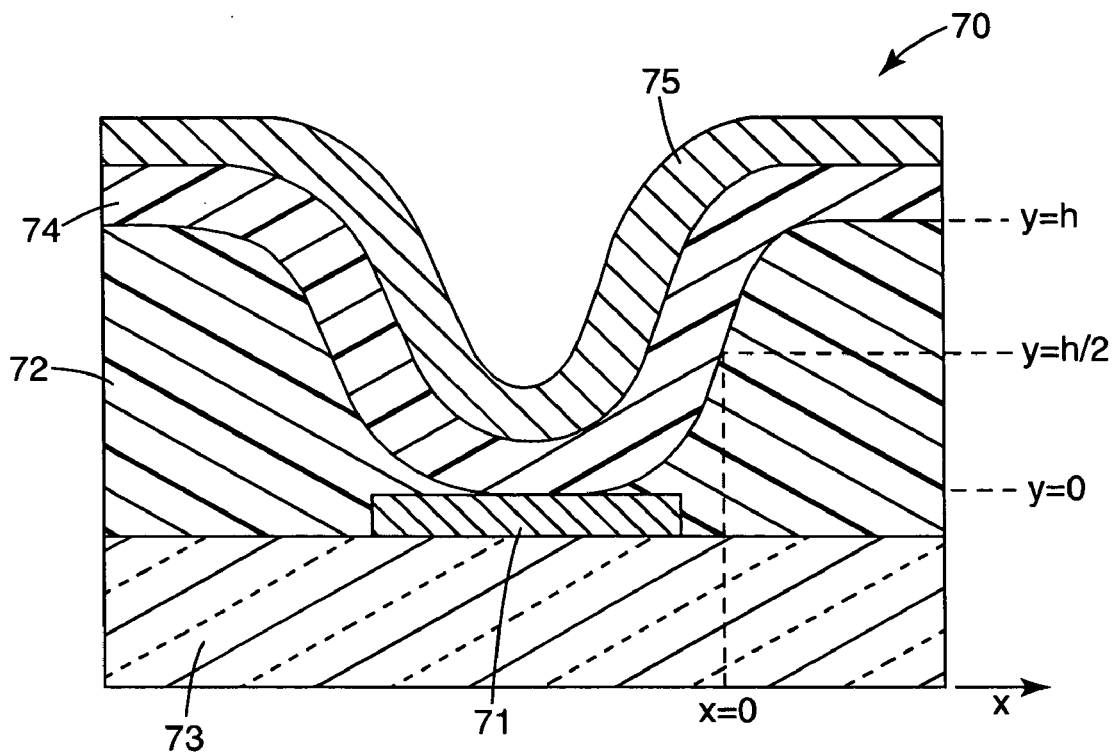
FIG. 7 is a schematic cross-sectional view of the configuration of an organic EL device of the present invention.

Above, the explanation was given of a bottom emission type organic EL device comprised of a transparent substrate, a transparent electrode, a functional layer, and a back electrode, but the present invention is not limited by the direction of taking out the light. That is, the present invention may also be applied to a top emission type organic EL device or a dual emission type organic EL device. Further, the present invention may also be applied to an organic EL device used as a pixel of an active drive type organic EL display or a passive drive type organic EL display. For example, as shown in FIG. 7, the EL device 70 of the present invention includes a substrate 73 on which a first electrode 71 is provided on the surface and including at least one projection 72, a functional layer 74 provided so as to cover the projection 72, and a second electrode 75 formed on that functional layer 74. This organic EL device is characterized in that a cross-sectional contour of an end of a surface of the projection contacting the functional layer is a shape shown by the following equation (1):

$$y = \frac{h}{1 + \exp\left(-\frac{x}{r}\right)}$$

wherein, h is a maximum height (nm) of the projection from its base, x is a distance (nm) in a horizontal direction having as its origin the position where y=h/2, y is a distance (nm) in a thickness direction of the projection, and r is a coefficient showing a smoothness of the cross-sectional shape) and the coefficient r satisfies the following relation (2):

$$r > -2000k + 1550$$

wherein, k=t/h and t is a thickness (nm) of the functional layer.

Figure 8:
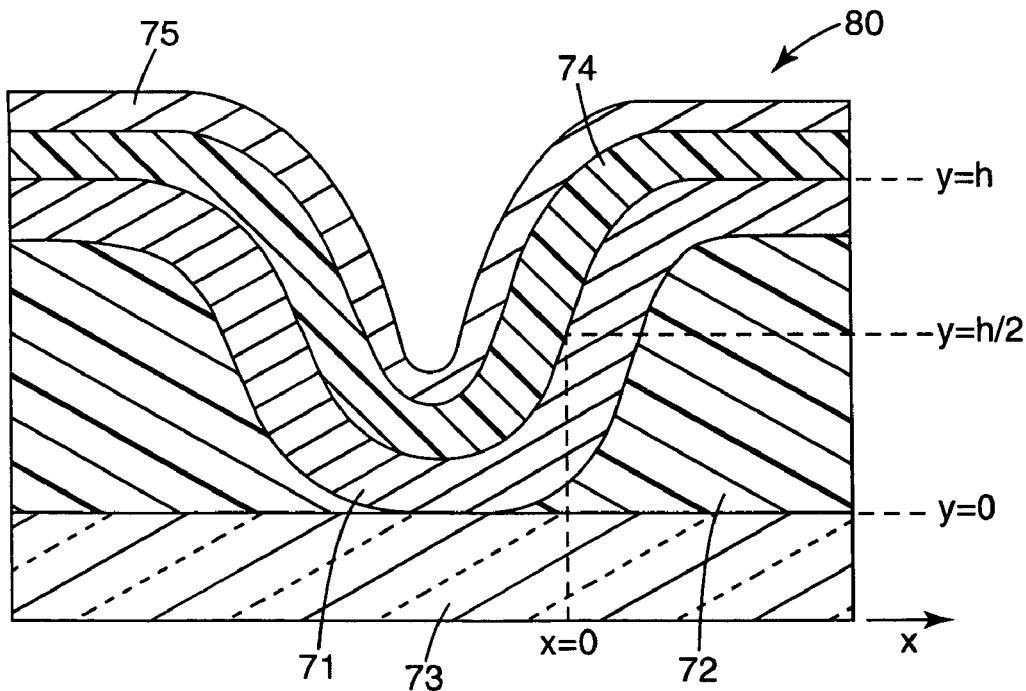
FIG. 8 is a schematic cross-sectional view of the configuration of an organic EL device of the present invention.
Figure 9:
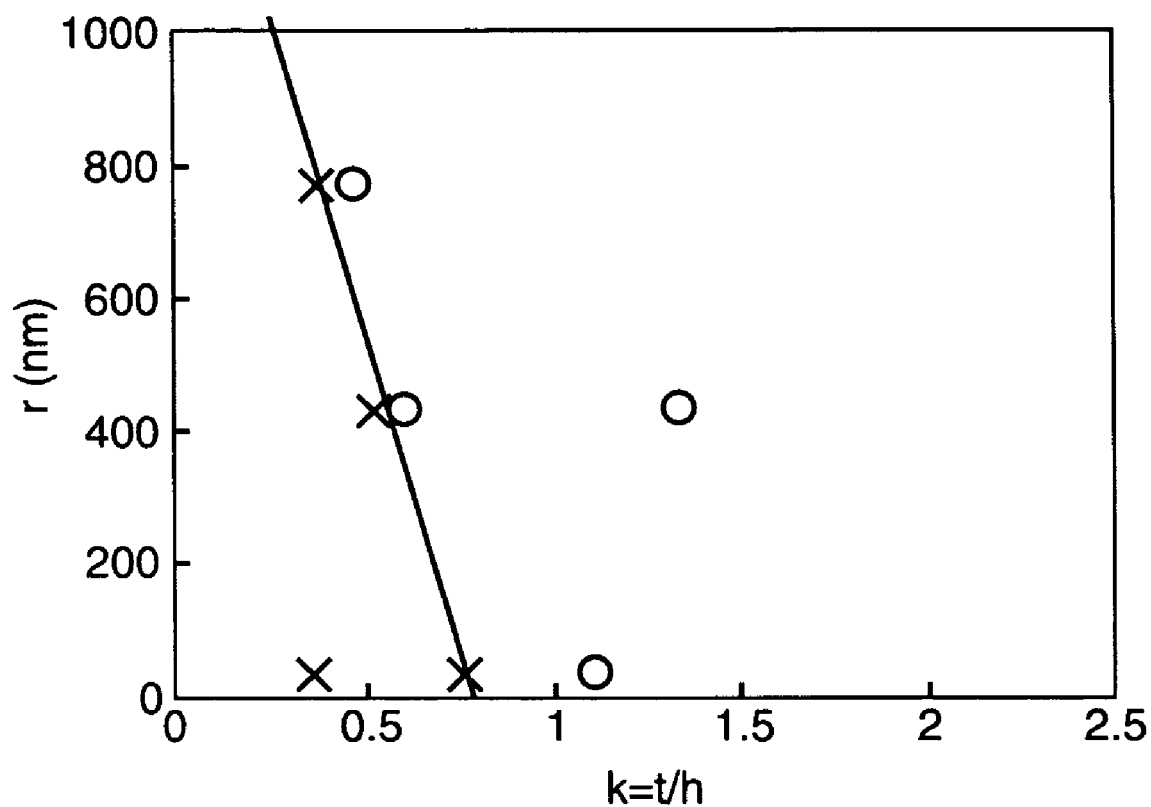
FIG. 9 is a graph of the results of examples and comparative examples of the present invention.

Further, FIG. 8 shows still another embodiment of an organic EL device of the present invention. In this organic EL device 80, the first electrode 71 is provided so as to cover the entire surface of the projection 72.

In the organic EL device shown in FIG. 7 and FIG. 8, the first electrode does not have to be transparent. When making the first electrode the cathode, it is possible to use a metal or alloy used for conventional organic EL devices such as magnesium, lithium, calcium, silver, aluminum, indium, cesium, copper, nickel, LiF, $MgFe_2$, etc. When the first electrode is made the anode, it is possible to use a metal or alloy used for anodes of conventional EL devices or electrodes for P-type semiconductors such as platinum, gold, palladium, indium, etc.

The second electrode does not have to be transparent in the case of a top emission type. The above transparent electrode materials such as indium tin oxide (ITO), a complex oxide of indium oxide and zinc oxide (IZO), etc. may be used.

The substrate does not have to be transparent in the case of a top emission type. A silicon substrate, plastic substrate, TFT plastic substrate, metal substrate, etc. may be used.

The projection means a pixel isolation layer used in an active matrix device. This pixel isolation layer has to be an insulator and is formed by a generally used resist material. As such a resist material, a heat resistant resist resistant to the effects of the heat generated at the time of laser transfer, for example, a photosensitive polyimide, a resist having an ethynyl group, a reaction development type resist, etc. is preferable. This pixel isolation layer can be formed by forming a resist layer over the entire substrate by coating or lamination, then using lithography.

EXAMPLES

Example 1

(1) Fabrication of Donor Sheet

As the base, a 75 μm thick polyethylene terephthalate (PET) film formed by the usual drawing and winding method was prepared. This PET film was formed with a photothermal conversion layer, an intermediate layer, and a transfer layer having the following compositions and thicknesses in that order. The photothermal conversion layer and the intermediate layer were formed by coating by the die coating method, then curing by irradiation of UV light, then the transfer layer was formed on top in the same way by the die coating method.

Photothermal Conversion Layer

Carbon black (made by Colombia Carbon, product name Raben 760, 100.0 wt %)

Dispersant (made by BYK-Chiemie, product name Disperbyk 161, 8.9 wt %)

Vinyl butyral resin (made by Monsanto Japan, product name Burvar B-98, 17.9 wt %)

Carboxyl group-containing acrylic resin (made by Johnson Polymer, product name Joncryi 67, 53.5 wt %)

Acryl oligomer (made by UCB Radcure, product name Evecryl EB629, 834.0 wt %)

Carboxyl group-containing acrylic resin (made by ICI, product name Elvacite 2669, 556.0 wt %)

Polymerization initiator (made by Ciba-Geigy, product name Irgacure 369, 45.2 wt %)

Polymerization initiator (made by Ciba-Geigy, product name Irgacure 184, 6.7 wt %)

Total 1622.3 wt %, solid content concentration 30%, PMA/MEK=60/40, film thickness 5 μm Intermediate Layer Vinyl butyral resin (made by Monsanto Japan, product name Burvar B-98, 4.76 wt %)

Carboxyl group-containing acrylic resin (made by Johnson Polymer, product name Joncryi 67, 14.29 wt %)

Acryl monomer (made by Sartomer, product name Sartomer 351, 79.45 wt %)

Polymerization initiator (made by Ciba-Geigy, product name Irgacure 369, 4.50 wt %)

Fluorescent dye (1.12 wt %)

Total 104.12 wt %, solid content concentration 9.3%, IPA/MEK=90/10, film thickness 1 μm Transfer Layer An organic film of a total thickness t of 155 nm comprised of three layers made of the following organic small molecule materials was formed by vapor deposition. First, tris(8-hydroxyquinoline)aluminum (III) (ALQ3) of a thickness of 50 nm was evaporated on an intermediate layer as an electron transport and light emitting layer. Next, bis[N-(1-naphthyl)-N-phenyl]benzidine (NPD) of a thickness of 100 nm was evaporated on this ALQ as a hole transport layer. Finally, copper phthalocyanine (CuPc) of a thickness of 5 nm was evaporated on the NPD as a hole injection layer. The evaporation speed and thickness of this evaporation layer were observed using a thickness sensor (made by INFICON, IC6000) using a quartz oscillator. The evaporation speed was about 3 Å/s in all cases. The materials used were all ones made by Nippon Steel Chemical. The background pressure of the vacuum tank was about $1.3 \times 10^{-5}$ Pa ($1 \times 10^{-7}$ Torr).

(2) Preparation of Glass Substrate Having ITO Patterns and Analysis of ITO Pattern Ends An ITO film-coated glass substrate (made by Sanyo Vacuum Industries, organic EL ITO film (SLR), ITO thickness: 150 nm, sheet resistance: <14 Ω/square, glass thickness: 0.7 mm) was patterned by photolithography to form stripe patterns (width 80 μm, length 3.5 mm, pitch 200 μm). The photolithography was performed by the following steps.

First, a surface inspection lamp was used to examine the exterior of the material to confirm there were no scratches, bends, stains, etc. Further, a tester was used to confirm the resistance of the ITO and confirm there were no abnormalities in the measurement value. Next, a laminator was used to coat a photoresist film having a negative sensitivity on the surface of the ITO film. At this time, it was confirmed that there were no wrinkles, air bubbles, or other abnormalities in appearance.

Next, an exposure machine was used for pattern exposure using a metal mask patterned by an electron beam in advance. At this time, it was confirmed that there were no offsets or other abnormalities. Next, a development machine was used to develop and wash the photoresist. At this time, it was confirmed there were no peeling, blistering, or other abnormalities in appearance.

Next, transmission illumination was used to compare the actual object with the drawings. At this time, whether there were any pinholes or other external abnormalities was carefully observed. Next, an etching machine was used for etching. At this time, whether there were any problems in the fluid state of the etching solution was confirmed. Next, a peeling machine was used for peeling and rinsing. At the time of peeling, the temperature of the peeling solution, pH value, pressure, and speed were suitably selected. Further, the state of quality of the peeling solution was monitored at all times.

Next, a rinsing and drying machine was used to rinse and dry the substrate. At this time, consideration was given to the quality and conductivity of the water used. Finally, a surface inspection lamp or incandescent lamp was used to confirm there were no scratches, pinholes, or stains on the pattern ITO film. Further, a tester was used to confirm there were no abnormalities in the resistance value.

Next, the shapes of the pattern ends of the pattern ITO were measured by a constant force mode (height mode) of an AFM (Digital Instruments Nano Scope III Multimode Scanning Probe Microscope). The cross-sectional contour of each end was extracted from the AFM image having an in-plane resolution of about 40 nm and vertical resolution of about 1 nm obtained as a result. From the results, a measurement value h of the thickness of the ITO of 139 was obtained. Further, by fitting the cross-sectional contour by equation (1), a radius of curvature r of 35 was found. As a result, in this example, k was 1.11.

(3) Transferred Shape of Small Molecule Organic Film Including Functional Layer of Organic EL Device to Substrate Surface Including Electrodes The surface of the transfer layer of the donor sheet prepared in accordance with the above routine was brought into close contact with the ITO pattern side of the glass substrate using a vacuum chuck. In this state, an Nd:YAG laser (wavelength 1064 nm, operating mode: TEMOO) was focused on a position corresponding to the ITO electrode pattern with an output of 6 W and a scan speed of about 4 m/sec. After this, the donor sheet was peeled off from the substrate surface to obtain a transfer pattern comprised of a three-layer organic film (CuPc/NPD/ALQ) of a width of about 100 μm and a pitch of 200 μm on the ITO electrode.

(4) Observation and Evaluation of Transfer Results at ITO Pattern Ends

After the transfer, the conformability of the small molecule organic film at the ITO pattern ends was found by observing for breakage of the transfer film using an optical microscope (Olympus BX60), fluorescent microscope (Nikon Optiphot-2), and AFM. The observation results were indicated as "Good (G)" when no breakage at all was observed and as "Poor (P)" when remarkable breakage was observed. As a result of observation, no breakage of the small molecule film at the ITO pattern ends could be observed, so the transfer result was "Good". The above results are shown in Table 1.

Comparative Example 1

Except for using a donor film having a 50 nm thick transfer layer formed by evaporating on an intermediate layer only 50 nm of ALQ, the steps described in Example 1 were repeated. The same technique as in Example 1 was used to examine the transfer film. As a result, remarkable breakage of the small molecule organic film was observed at the ITO pattern ends, so the transfer result was "Poor". Further, the result of AFM observation was a radius of curvature r of 35 nm. In this example, the total thickness t of the transfer layer was 50 mm and the ITO height h was 139 nm, so k was 0.36.

Comparative Example 2

Except for using a donor film having a 105 nm thick transfer layer formed by successively evaporating on an intermediate layer 50 nm of ALQ, 50 nm of NPD, and 5 nm of CuPc, the steps described in Example 1 were repeated. The same technique as in Example 1 was used to examine the transfer film. As a result, remarkable breakage of the small molecule organic film was observed at the ITO pattern ends, so the transfer result was "Poor". Further, the result of AFM observation was a radius of curvature r of 35 nm. In this example, the total thickness t of the transfer layer was 105 mm and the ITO height h was 139 nm, so k was 0.75.

Example 2

Except for using an ITO film-coated glass substrate different from Example 1 (made by Sanyo Vacuum Industries, organic EL ITO film (SLR), ITO thickness: 150 nm, sheet resistance: <10 Ω/square, glass thickness: 0.7 mm), the steps described in Example 1 were repeated. The same technique as in Example 1 was used to examine the transfer film. As a result, no breakage of the small molecule organic film was observed at the ITO pattern ends, so the transfer result was "Good". Further, the result of AFM observation was a radius of curvature r of 431 nm. In this example, the total thickness t of the transfer layer was 155 mm and the ITO height h was 115 nm, so k was 1.35.

Example 3

Except for using a donor film having a 70 nm thick transfer layer formed by successively evaporating on an intermediate layer 45 nm of ALQ, 20 nm of NPD, and 5 nm of CuPc, the steps described in Example 2 were repeated. The same technique as in Example 1 was used to examine the transfer film. As a result, no breakage of the small molecule organic film was observed at the ITO pattern ends, so the transfer result was "Good". Further, the result of AFM observation was a radius of curvature r of 431 nm. In this example, the total thickness t of the transfer layer was 70 mm and the ITO height h was 115 nm, so k was 0.61.

Comparative Example 3

Except for using a donor film having a 60 nm thick transfer layer formed by successively evaporating on an intermediate layer 45 nm of ALQ, 10 nm of NPD, and 5 nm of CuPc, the steps described in Example 2 were repeated. The same technique as in Example 1 was used to examine the transfer film. As a result, remarkable breakage of the small molecule organic film was observed at the ITO pattern ends, so the transfer result was "Poor". Further, the result of AFM observation was a radius of curvature r of 431 nm. In this example, the total thickness t of the transfer layer was 60 mm and the ITO height h was 115 nm, so k was 0.52.

Example 4

Except for using a donor film having a 90 nm thick transfer layer formed by successively evaporating on an intermediate layer 45 nm of ALQ, 40 nm of NPD, and 5 nm of CuPc and an ITO film-coated glass substrate different from Example 1 (made by Kuramoto Seisakusho, polished ITO-coated glass substrate, thickness: 150 nm, sheet resistance: <10 Ω/square, glass thickness: 0.7 mm), the steps described in Example 1 were repeated. The same technique as in Example 1 was used to examine the transfer film. As a result, no breakage of the small molecule organic film was observed at the ITO pattern ends, so the transfer result was "Good". Further, the result of AFM observation was a radius of curvature r of 771 nm. In this example, the total thickness t of the transfer layer was 90 mm and the ITO height h was 187 nm, so k was 0.48.

Comparative Example 4

Except for using a donor film having a 70 nm thick transfer layer formed by successively evaporating on an intermediate layer 45 nm of ALQ, 20 nm of NPD, and 5 nm of CuPc, the steps described in Example 4 were repeated. The same technique as in Example 1 was used to examine the transfer film. As a result, remarkable breakage of the small molecule organic film was observed at the ITO pattern ends, so the transfer result was "Poor". Further, the result of AFM observation was a radius of curvature r of 771 nm. In this example, the total thickness t of the transfer layer was 70 mm and the ITO height h was 187 nm, so k was 0.37.

The results are summarized in the following Table 1.

TABLE 1

SUMMARY OF TRANSFER RESULTS

| | Alg (nm) | NPD (nm) | CuPc (nm) | t (nm) | h (nm) | k (=t/h) | r (nm) | Transfer result |
|---|---|---|---|---|---|---|---|---|
| Ex. 1 | 50 | 100 | 5 | 155 | 139 | 1.11 | 35 | G |
| Ex. 2 | 45 | 20 | 5 | 70 | 115 | 0.61 | 431 | G |
| Ex. 3 | 50 | 100 | 5 | 155 | 115 | 1.35 | 431 | G |
| Ex. 4 | 45 | 40 | 5 | 90 | 187 | 0.48 | 771 | G |
| Comp. Ex. 1 | 50 | 0 | 0 | 50 | 139 | 0.36 | 35 | P |
| Comp. Ex. 2 | 50 | 50 | 5 | 105 | 139 | 0.75 | 35 | P |
| Comp. Ex. 3 | 45 | 10 | 5 | 60 | 115 | 0.52 | 431 | P |
| Comp. Ex. 4 | 45 | 20 | 5 | 70 | 187 | 0.37 | 771 | P |

FIG. 7 plots the results of the above examples and comparative examples with k on the abscissa and r on the ordinate. No breakage of the transfer film at the ITO ends at all is indicated as "G (good)", while overall breakage is indicated as "P (poor)". The straight line in the graph indicates the boundary of the regions expressed by the conditional relation (2).

According to the present invention, in the production of an organic EL display, it is possible to form a large number of miniature organic EL devices on a single substrate by the laser transfer method with a high positional accuracy and effectively prevent breakage of the functional layers and prevent the formation of short-circuits between first electrodes and second electrodes.

What is claimed is:

1. An organic electroluminescence device comprising:
a substrate on which a first electrode is provided on the surface and including at least one projection, a functional layer provided so as to cover the projection, and a second electrode formed on that functional layer, the organic electroluminescence device characterized in that a cross-sectional contour of an end of a surface of the projection contacting the functional layer is a shape shown by the following equation:

$$y = \frac{h}{1 + \exp\left(-\frac{x}{r}\right)}$$

wherein, h is a maximum height (nm) of the projection from its base, x is a distance (nm) in a horizontal direction having as its origin the position where y=h/2, y is a distance (nm) in a thickness direction of the projection, and r is a coefficient showing a smoothness of the cross-sectional shape) and the coefficient r satisfies the following relation:

$r > -2000k + 1550$ wherein, k=t/h and t is a thickness (nm) of the functional layer.

2. An organic electroluminescence device comprising:
a transparent substrate, a transparent electrode arranged on the transparent substrate, a functional layer formed on the transparent electrode, and a back electrode formed on the functional layer, the organic electroluminescence device characterized in that a cross-sectional contour of an end of a surface of the transparent electrode contacting the functional layer is a shape shown by the following equation:

$$y = \frac{h}{1 + \exp\left(-\frac{x}{r}\right)}$$

wherein, h is a maximum height (nm) of the transparent electrode from its base, x is a distance (nm) in a horizontal direction having as its origin the position where y=h/2, y is a distance (nm) in a thickness direction of the transparent electrode, and r is a coefficient showing a smoothness of the cross-sectional shape) and the coefficient r satisfies the following relation:

$r > -2000k + 1550$ wherein, k=t/h and t is a thickness (nm) of the functional layer.

3. A method of producing an organic electroluminescence device, comprising:
bringing into contact with the surface of a projection side of a substrate provided with a first electrode on its surface and including at least one projection a transfer layer of a donor sheet comprised of a base and a photothermal conversion layer and transfer layer formed successively on it, irradiating laser light from the base side of the donor sheet to heat the transfer layer, and transferring it on the projection, wherein a cross-sectional contour of an end of a surface of the projection contacting the functional layer is a shape shown by the following equation:

$$y = \frac{h}{1 + \exp\left(-\frac{x}{r}\right)}$$

wherein, h is a maximum height (nm) of the projection from its base, x is a distance (nm) in a horizontal direction having as its origin the position where y=h/2, y is a distance (nm) in a thickness direction of the projection, and r is a coefficient showing a smoothness of the cross-sectional shape) and the coefficient r satisfies the following relation:

$r > -2000k + 1550$ wherein, k=t/h and t is a thickness (nm) of the functional layer.

4. A method of producing an organic electroluminescence device, comprising:
forming a transparent electrode on a transparent substrate, bringing into contact with the surface of the transparent electrode side of the substrate a transfer layer of a donor sheet comprised of a base and a photothermal conversion layer and transfer layer formed successively on it, irradiating laser light from the base side of the donor sheet to heat the transfer layer, and transferring it on the substrate, wherein a cross-sectional contour of an end of a surface of the transparent electrode contacting the transfer layer is a shape shown by the following equation:

$$y = \frac{h}{1+\exp\left(-\frac{x}{r}\right)}$$

wherein, h is a maximum height (nm) of the transparent electrode from its base, x is a distance (nm) in a horizontal direction having as its origin the position where y=h/2, y is a distance (nm) in a thickness direction of the transparent electrode, and r is a coefficient showing a smoothness of the cross-sectional shape) and the coefficient r satisfies the following relation:

$r > -2000k+1550$ wherein, k=t/h and t is a thickness (nm) of the functional layer.

5. A method of production of an organic electroluminescence device as set forth in claim 3, wherein the donor sheet further includes an intermediate layer arranged between the transfer layer and photothermal conversion layer.

6. A method of production of an organic electroluminescence device as set forth in claim 3, wherein the transfer layer is a three-layer structure of a hole transport layer, an electron transport layer, and a back electrode stacked together.

7. A method of production of an organic electroluminescence device as set forth in claim 3, wherein the transfer layer is a two-layer structure of a hole transport layer and an electron transport layer stacked together, and, after the transfer layer is transferred, the transfer layer is formed with a back electrode.

8. A method of production of an organic electroluminescence device as set forth in claim 3, wherein the transfer layer is comprised of a hole transport layer, and, after the transfer layer is transferred, the transfer layer is successively formed with an electron transport layer and a back electrode.

9. A method of production of an organic electroluminescence device as set forth in claim 3, wherein the transfer layer is comprised of an electron transport layer, and, after the transfer layer is transferred, the transfer layer is successively formed with a hole transport layer and a back electrode.

* * * * *